United States Patent
Sasaki

(10) Patent No.: US 7,590,357 B2
(45) Date of Patent: Sep. 15, 2009

(54) OPTICAL MODULE HAVING SMALL STRAY CAPACITANCE AND STRAY INDUCTANCE

(75) Inventor: Kazuya Sasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 598 days.

(21) Appl. No.: 10/835,008

(22) Filed: Apr. 30, 2004

(65) Prior Publication Data
US 2005/0175352 A1    Aug. 11, 2005

(30) Foreign Application Priority Data
Jan. 23, 2004    (JP) .............................. 2004-016197

(51) Int. Cl.
*H04B 10/00* (2006.01)
(52) U.S. Cl. ................. 398/164; 398/140; 398/135; 398/138
(58) Field of Classification Search ................. 398/138, 398/30, 164, 140, 171, 141, 165, 135, 139, 398/128, 130; 257/98; 430/316
See application file for complete search history.

(56) References Cited
U.S. PATENT DOCUMENTS

| | | | | |
|---|---|---|---|---|
| 5,742,480 A | * | 4/1998 | Sawada et al. ............... | 361/749 |
| 5,780,875 A | * | 7/1998 | Tsuji et al. ..................... | 257/81 |
| 5,939,835 A | * | 8/1999 | Takeda et al. ............ | 315/209 R |
| 6,929,900 B2 | * | 8/2005 | Farquhar et al. ............. | 430/311 |
| 2003/0127712 A1 | * | 7/2003 | Murakami et al. .......... | 257/666 |
| 2003/0169808 A1 | * | 9/2003 | Yukutake et al. ............. | 375/222 |
| 2003/0209793 A1 | * | 11/2003 | Nishizawa et al. .......... | 257/679 |

FOREIGN PATENT DOCUMENTS

| | | |
|---|---|---|
| JP | 08-136767 | 5/1996 |
| JP | 2001-298217 | 10/2001 |
| JP | 2003-249711 | 9/2003 |

\* cited by examiner

*Primary Examiner*—M. R. Sedighian
(74) *Attorney, Agent, or Firm*—Staas & Halsey LLP

(57) ABSTRACT

An optical module including an optical element package accommodating an optical element and having a high-speed signal lead terminal, a power supply lead terminal, and a grounding lead terminal; a main printed wiring board on which an integrated circuit is mounted; an auxiliary printed wiring board on which a capacitive component is mounted, the auxiliary printed wiring board being arranged so as to be substantially perpendicular to the main printed wiring board; and a wiring component for connecting the main printed wiring board and the auxiliary printed wiring board. The power supply lead terminal and the grounding lead terminal are connected to the auxiliary printed wiring board, and the high-speed signal lead terminal is directly connected to the main printed wiring board.

13 Claims, 9 Drawing Sheets

OPTICAL MODULE HAVING SMALL STRAY CAPACITANCE AND STRAY INDUCTANCE

BACKGROUND OF THE INVENTION

1. Field of the Invention

The present invention relates to an optical module for use in a high-speed optical communication apparatus, a measuring instrument, etc.

2. Description of the Related Art

An optical module such as a light emitting module or a photodetecting module for use in an optical communication apparatus or the like is configured by accommodating an optical element such as a laser diode or a photodiode and other components in a metal cylindrical package called a coaxial type package which is low in cost and easy to handle, and connecting the optical element and the other components through wires or the like to lead terminals for supplying a signal and power. In driving the optical element accommodated in the coaxial type package, band degradation or the like is caused by the influence of a stray capacitance, stray inductance, etc. present in the package structure and the internal components, so that there arises a problem in characteristics.

More specifically, the lead terminals for connecting the optical element in the package to an external component have a function as an inductor and also have a capacitance to the metal package. Accordingly, in the case of using this optical module in a GHz band, resonance occurs at a certain frequency and the band becomes narrow, so that desired characteristics cannot be obtained. As a method for solving such a problem at present, it is known that a capacitive component such as a capacitor is connected near the package between a lead terminal mechanically and electrically connected to the package and another lead terminal electrically connected to the optical element in the package and having a potential different from the potential of the package, thereby short-circuiting a stray capacitance. As another method, it is known that the lead terminals are cut into minimum lengths and a capacitive component (e.g., capacitor) is located very close to a wiring board to which the lead terminals are connected.

In such conventional optical modules, the connection of a capacitive component between the lead terminals near the package has a disadvantage in mountability and reliability, and there is a limit to the location of the capacitive component between the lead terminals near the package because of the limitation to bending of another functional terminal. Thus, the above conventional methods have little effect on a reduction in stray capacitance and stray inductance of the high-frequency component accommodated in the package. In the case of locating a flexible printed wiring board near the package and mounting components on the flexible printed wiring board, a high-speed signal lead terminal is also connected to the flexible printed wiring board, so that impedance matching cannot be effected because of the limitation to the material (permittivity) of a flexible member of this printed wiring board and the thickness of this printed wiring board, resulting in a problem such that a desired optical waveform cannot be obtained.

In the case of a combined transmission/reception optical element package for an access system such as fiber to the home (FTTH), the ground potential of the package becomes different from that of a main printed wiring board with only a grounding lead terminal for each optical element, causing a characteristics degradation due to power supply noise. Further, with only a power supply lead terminal, the impedance becomes high to cause the radiation of radio waves, resulting in a problem such that EMI characteristics cannot be ensured.

Some conventional structures of such an optical module will now be described with reference to the drawings. Referring to FIG. 1, there is shown a plan view of an optical module 2A as a first example of the prior art. FIG. 2 is a cross section taken along the line 2-2 in FIG. 1, and FIG. 3 is a cross section taken along the line 3-3 in FIG. 1. The optical module 2A includes an optical element package 4. The optical element package 4 includes a metal casing and an optical element accommodated in the metal casing. The optical element is a light emitting element such as a laser diode or a photodetecting element such as a photodiode. In the case that the optical element is a light emitting element, a drive circuit for driving the light emitting element is mounted on a printed wiring board 6. In the case that the optical element is a photodetecting element, a preamplifier is accommodated in the metal casing and a post amplifier is mounted on the printed wiring board 6.

The optical element package 4 has a power supply lead terminal 10 and a grounding lead terminal 12. These lead terminals 10 and 12 are cut into suitable lengths and connected to the printed wiring board 6 by soldering or the like. A capacitor 16 for reducing a stray capacitance is mounted on the printed wiring board 6 so as to connect the power supply lead terminal 10 and the grounding lead terminal 12. A high-speed signal lead terminal 8 is also cut into a suitable length and connected to the printed wiring board 6. Reference numeral 14 denotes a lead terminal connected to a monitoring photodiode accommodated in the optical element package 4. In the optical module 2A, the distance between the optical element package 4 and the printed wiring board 6 must be ensured to some extent because of the limitation to bending of each lead terminal, and the position of the capacitor 16 is therefore far from the optical element package 4, so that a reduction in stray capacitance cannot be so expected.

Referring to FIG. 4, there is shown a plan view of an optical module 2B as a second example of the prior art. FIG. 5 is a cross section taken along the line 5-5 in FIG. 4, and FIG. 6 is a cross section taken along the line 6-6 in FIG. 4. The optical module 2B is different from the optical module 2A shown in FIG. 1 in the point that the capacitor 16 is directly mounted between the power supply lead terminal 10 and the grounding lead terminal 12 adjacent to each other. In this case, the capacitor 16 is mounted to a lead portion having a low working accuracy, so that the mountability is reduced. Furthermore, a stress due to expansion and contraction of each member according to temperature changes is concentrated at a soldered portion, so that there is a possibility of reduction in reliability due to the rupture of the soldered portion.

Referring to FIG. 7, there is shown a plan view of an optical module 2C as a third example of the prior art. FIG. 8 is a cross section taken along the line 8-8 in FIG. 7, and FIG. 9 is a cross section taken along the line 9-9 in FIG. 7. The optical module 2C includes an auxiliary printed wiring board 18 arranged substantially perpendicularly to the main printed wiring board 6 and a flexible printed wiring board 20 for connecting the auxiliary printed wiring board 18 to the main printed wiring board 6.

All the lead terminals 8, 10, 12, and 14 are cut into suitable shorter lengths and connected to the auxiliary printed wiring board 18 by soldering or the like. The capacitor 16 is mounted on the auxiliary printed wiring board 18 at a position near lead terminal connected portions. In this case, a high-speed signal line extends through the auxiliary printed wiring board 18 and the flexible printed wiring board 20, so that the wiring length of the high-speed signal line becomes large to cause an increase in inductance, resulting in characteristics degradation. Further, impedance control is difficult because of the material characteristics of the flexible printed wiring board, causing characteristics degradation.

SUMMARY OF THE INVENTION

It is therefore an object of the present invention to provide an optical module which can reduce the stray capacitance and stray inductance of an optical element package and can stabilize the ground potential of the optical element package.

In accordance with an aspect of the present invention, there is provided an optical module including an optical element package accommodating an optical element and having a high-speed signal lead terminal, a power supply lead terminal, and a grounding lead terminal each connected to the optical element; a main printed wiring board on which an integrated circuit is mounted; an auxiliary printed wiring board on which a capacitive component is mounted, the auxiliary printed wiring board being arranged substantially perpendicular to the main printed wiring board; and a wiring component for connecting the main printed wiring board and the auxiliary printed wiring board; the power supply lead terminal and the grounding lead terminal being connected to the auxiliary printed wiring board; the high-speed signal lead terminal being directly connected to the main printed wiring board.

Preferably, the wiring component has flexibility. In the case that the optical element comprises a light emitting element, the integrated circuit comprises a drive circuit for driving the light emitting element. In the case that the optical element comprises a photodetecting element, the integrated circuit comprises a postamplifier for amplifying a current obtained by photoelectric conversion by the photodetecting element. Preferably, the wiring component comprises a meshed wiring board.

Preferably, the wiring component has at least two connecting portions separated from each other in laterally opposite directions with respect to the center of arrangement of the high-speed signal lead terminal, the power supply lead terminal, and the grounding lead terminal. Alternatively, the wiring component may be located opposite to the high-speed signal lead terminal with respect to the center of arrangement of the high-speed signal lead terminal, the power supply lead terminal, and the grounding lead terminal.

In accordance with another aspect of the present invention, there is provided an optical module including an optical element package accommodating an optical element and having a high-speed signal lead terminal, a power supply lead terminal, and a grounding lead terminal each connected to the optical element; a main printed wiring board on which an integrated circuit is mounted, the main printed wiring board having a recess; an auxiliary printed wiring board on which a capacitive component is mounted, the auxiliary printed wiring board being arranged substantially perpendicular to the main printed wiring board; and a flexible wiring component for connecting the auxiliary printed wiring board and an end portion of the main printed wiring board, the end portion defining the recess of the main printed wiring board; the power supply lead terminal and the grounding lead terminal being connected to the auxiliary printed wiring board; the high-speed signal lead terminal being directly connected to the main printed wiring board.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
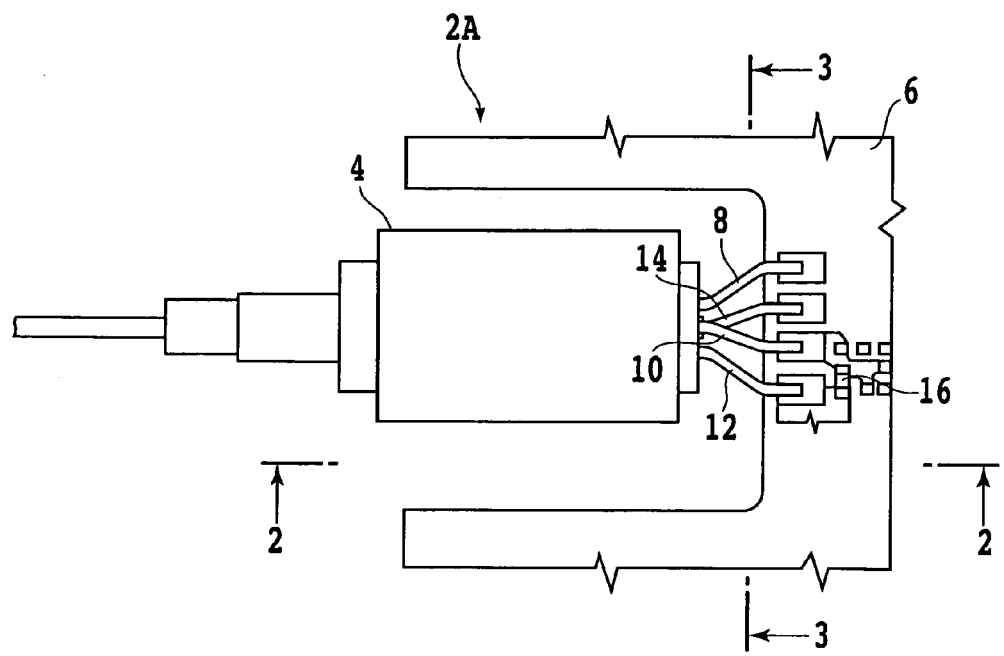
FIG. 1 is a plan view of an optical module as a first example of the prior art.
Figure 2:
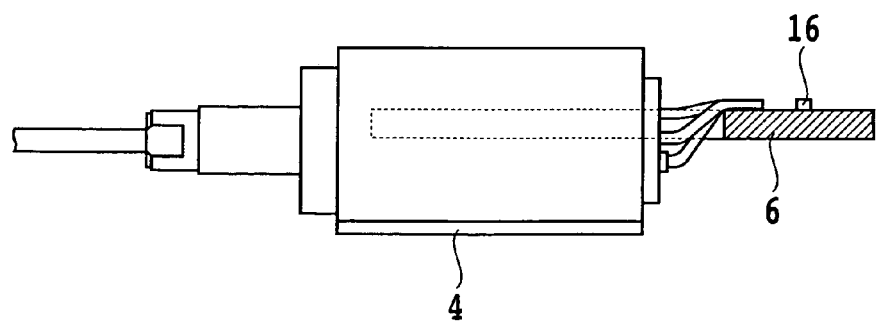
FIG. 2 is a cross section taken along the line 2-2 in FIG. 1.
Figure 3:
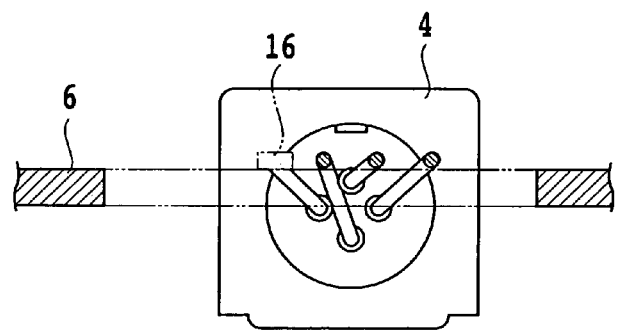
FIG. 3 is a cross section taken along the line 3-3 in FIG. 1.
Figure 4:
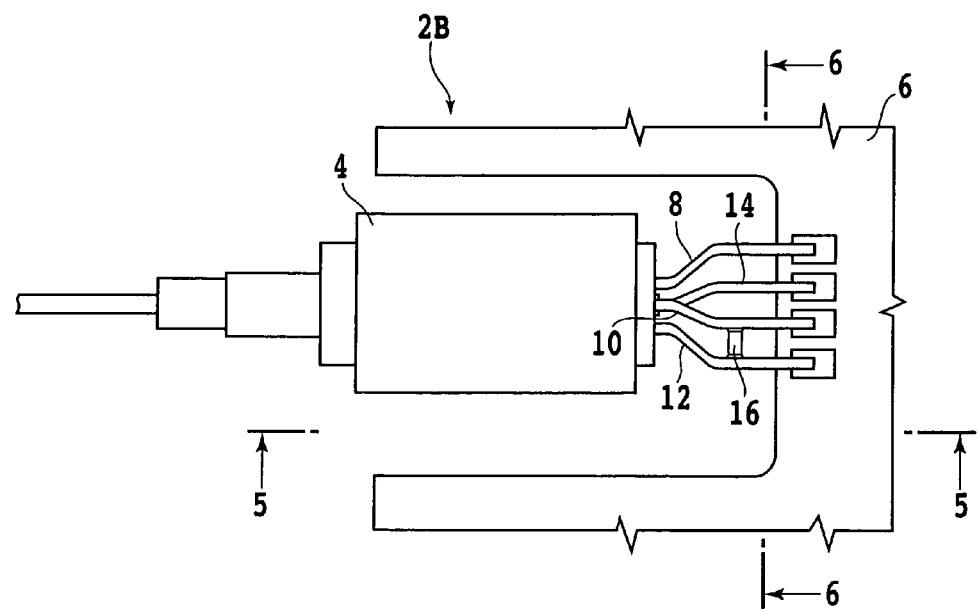
FIG. 4 is a plan view of an optical module as a second example of the prior art.
Figure 5:
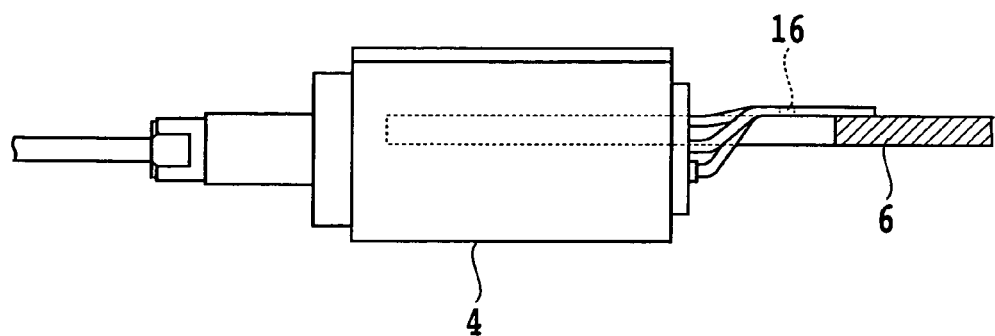
FIG. 5 is a cross section taken along the line 5-5 in FIG. 4.
Figure 6:
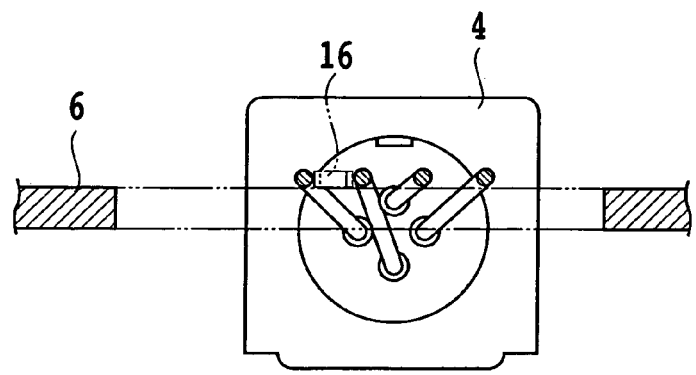
FIG. 6 is a cross section taken along the line 6-6 in FIG. 4.
Figure 7:
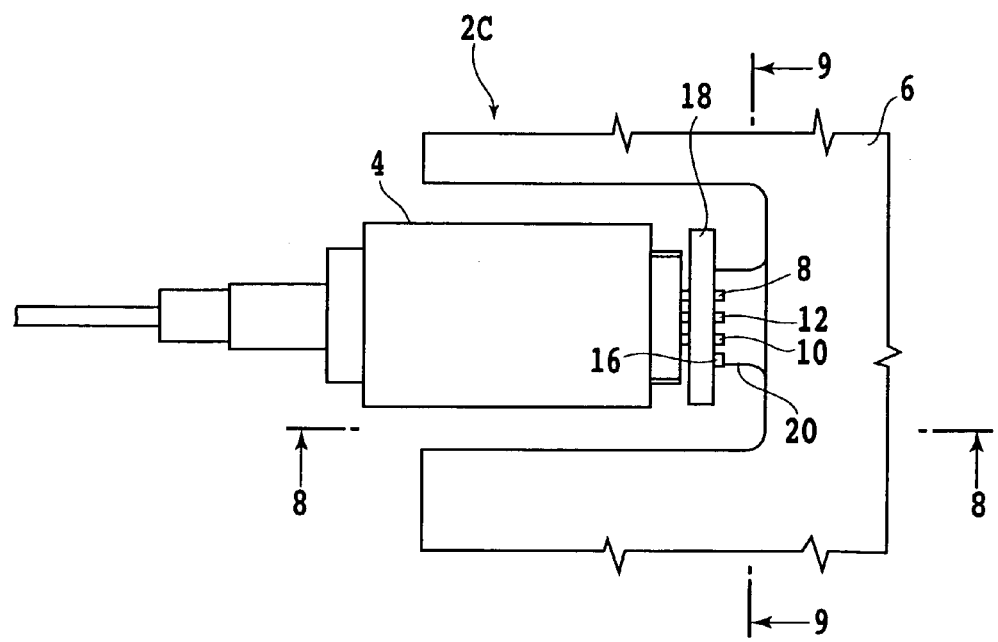
FIG. 7 is a plan view of an optical module as a third example of the prior art.
Figure 8:
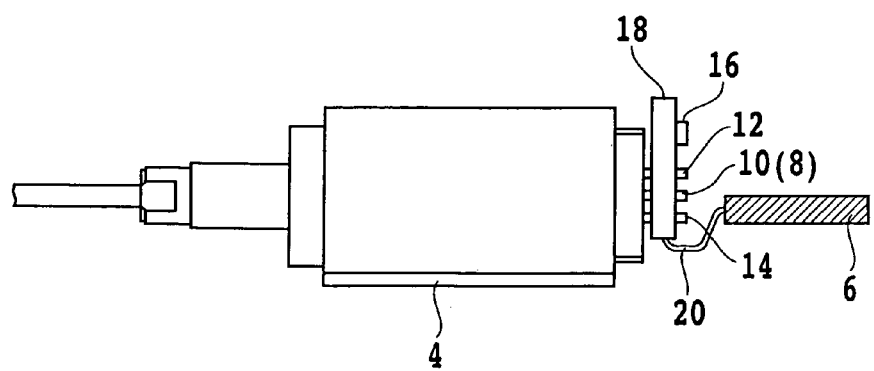
FIG. 8 is a cross section taken along the line 8-8 in FIG. 7.
Figure 9:
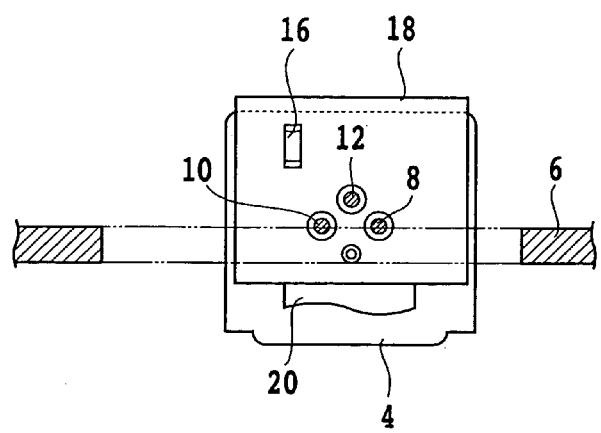
FIG. 9 is a cross section taken along the line 9-9 in FIG. 7.

Some preferred embodiments of the present invention will now be described in detail with reference to the drawings. Throughout the drawings showing the preferred embodiments, substantially the same parts are denoted by the same reference numerals.

Figure 10:
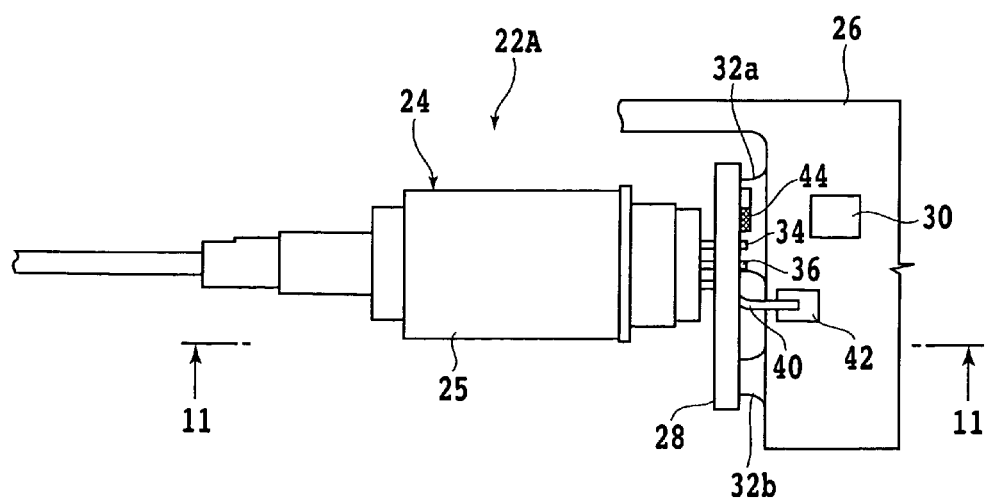
FIG. 10 is a plan view of an optical module according to a first preferred embodiment of the present invention.
Figure 11:
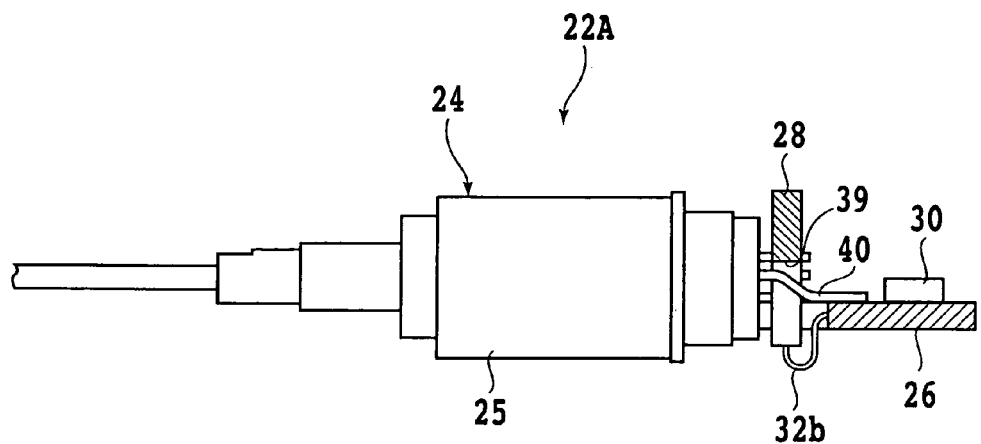
FIG. 11 is a cross section taken along the line 11-11 in FIG. 10.
Figure 12:
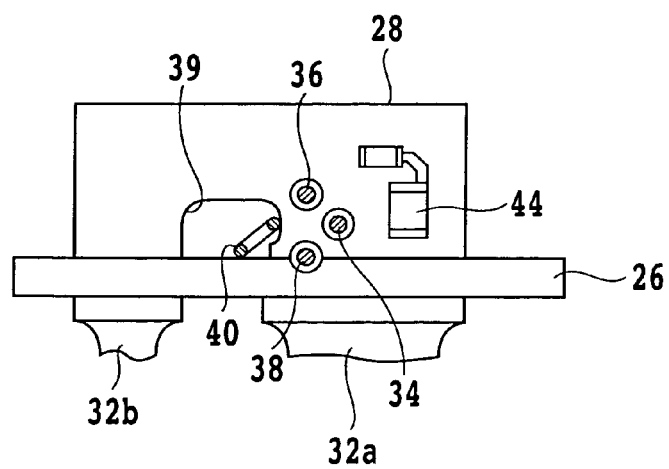
FIG. 12 is a right side view of FIG. 10.

Referring to FIG. 10, there is shown a plan view of an optical module 22A according to a first preferred embodiment of the present invention. FIG. 11 is a cross section taken along the line 11-11 in FIG. 10, and FIG. 12 is a right side view of FIG. 10. The optical module 22A includes an optical element package 24. The optical element package 24 includes a metal casing 25 and an optical element accommodated in the metal casing 25.

In the case that the optical element is a light emitting element such as a laser diode, a monitoring photodiode is also accommodated in the metal casing 25. In the case that the optical element is a photodetecting element such as a photodiode, a preamplifier for amplifying a current obtained by photoelectric conversion by the photodiode is also accommodated in the metal casing 25. The optical module 22A further includes a main printed wiring board 26. An LSI 30 is mounted on the main printed wiring board 26. In the case that the optical element in the optical element package 24 is a laser diode, the LSI 30 is configured by a laser diode driving circuit for driving the laser diode. In the case that the optical element in the optical element package 24 is a photodiode, the LSI 30 is configured by a postamplifier for further amplifying a current amplified by the preamplifier accommodated in the metal casing 25.

An auxiliary printed wiring board 28 is located very close to the optical element package 24 so as to be substantially perpendicular to the main printed wiring board 26. The auxiliary printed wiring board 28 is connected through a pair of flexible printed wiring boards 32a and 32b to the main printed wiring board 26. The optical element package 24 has a power supply lead terminal 34, a grounding lead terminal 36, a monitoring lead terminal 38, and a high-speed signal lead terminal 40. The power supply lead terminal 34, the grounding lead terminal 36, and the monitoring lead terminal 38 are cut into very short lengths and connected to the auxiliary printed wiring board 28 by soldering or the like.

A capacitor 44 for reducing a stray capacitance is mounted on the auxiliary printed wiring board 28 at a position near connection points of these lead terminals 34, 36, and 38. The auxiliary printed wiring board 28 has a recess 39, and the high-speed signal lead terminal 40 having a short length extends through the recess 39 and is directly connected to a conductive pad 42 mounted on the main printed wiring board 26.

Figure 13:
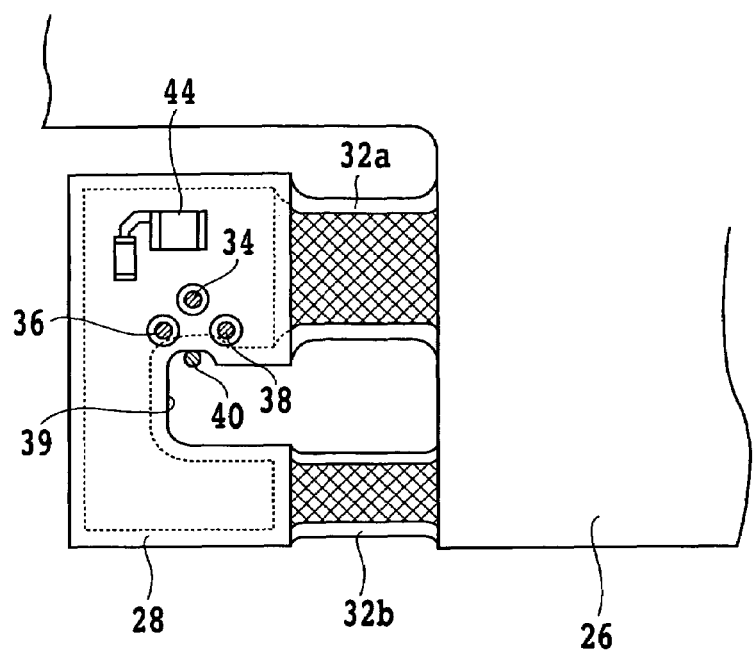
FIG. 13 is a plan view showing a condition where a main printed wiring board and an auxiliary printed wiring board in the first preferred embodiment are developed in the same plane.

FIG. 13 shows a condition where the auxiliary printed wiring board 28 and the main printed wiring board 26 are developed in the same plane. In this condition, the power supply lead terminal 34, the grounding lead terminal 36, and the monitoring lead terminal 38 of the optical element package 24 are connected to the auxiliary printed wiring board 28 by soldering or the like. Thereafter, the auxiliary printed wiring board 28 is raised so as to be substantially perpendicular to the main printed wiring board 26. The condition shown in FIG. 13 is a condition for simultaneous and automated mounting of components on the main printed wiring board 26 and the auxiliary printed wiring board 28, whereby an optical module excellent in productivity can be realized.

As best shown in FIG. 13, the flexible printed wiring boards 32a and 32b are arranged so as to be separated from each other in laterally opposite directions with respect to the center of arrangement of the high-speed signal lead terminal 40, the power supply lead terminal 34, and the grounding lead terminal 36. According to this preferred embodiment, the auxiliary printed wiring board 28 is connected through the flexible printed wiring boards 32a and 32b each having a large area to the main printed wiring board 26, so that a ground potential can be stabilized and the area of power supply wiring can be enlarged to thereby reduce an impedance.

Further, the flexible printed wiring boards 32a and 32b are used for the connection of the auxiliary printed wiring board 28 and the main printed wiring board 26, so that there is no influence of variations in positions of the lead terminals due to product nonuniformity in the optical element package 24. Further, the needs for cutting of the lead terminals and for ensuring of the dimensional accuracy of the lead terminals in the prior art can be eliminated to thereby improve the productivity. A large feature of the optical module 22A is to cut the high-speed signal lead terminal 40 of the optical element package 24 into a short length and to directly connect this lead terminal 40 to the main printed wiring board 26. Accordingly, the inductance of a high-speed signal can be reduced to thereby improve the characteristics of the optical module 22A.

Figure 14:
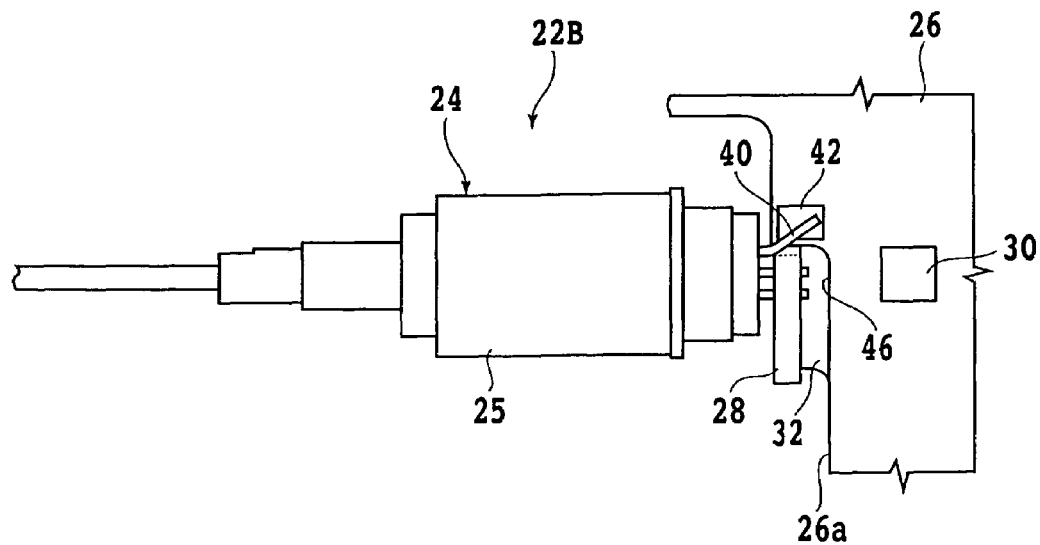
FIG. 14 is a plan view of an optical module according to a second preferred embodiment of the present invention.
Figure 15:
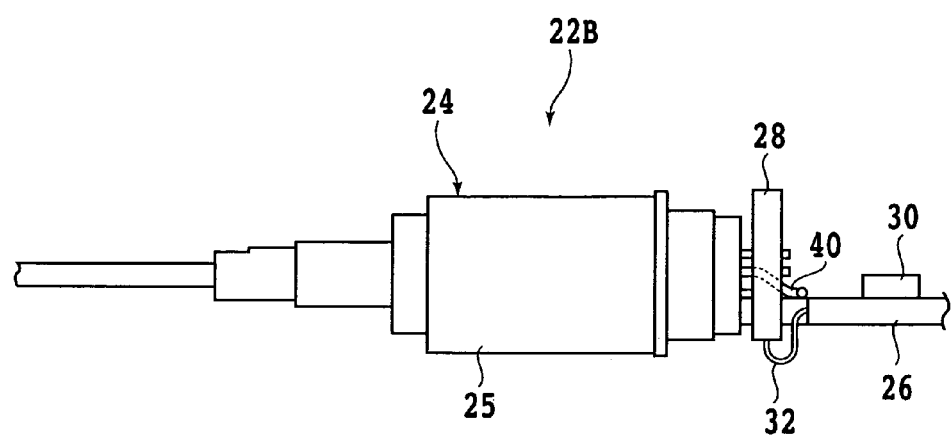
FIG. 15 is an elevational view of FIG. 14.
Figure 16:
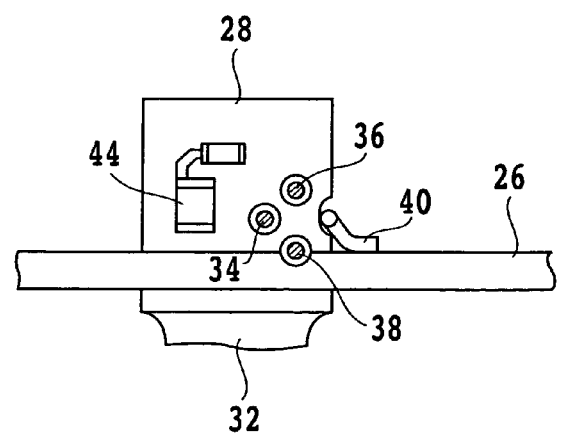
FIG. 16 is a right side view of FIG. 14.

Referring to FIG. 14, there is shown a plan view of an optical module 22B according to a second preferred embodiment of the present invention. FIG. 15 is an elevational view of FIG. 14, and FIG. 16 is a right side view of FIG. 14. The optical module 22B includes an optical element package 24, a main printed wiring board 26 having a recess 46, an auxiliary printed wiring board 28 located in the recess 46, and a flexible printed wiring board 32 for connecting the auxiliary printed wiring board 28 to the main printed wiring board 26. A high-speed signal lead terminal 40 is connected to a conductive pad 42 mounted on the main printed wiring board 26.

The conductive pad 42 is located nearer to the optical element package 24 as compared with the first preferred embodiment, so as to more reduce the inductance of a high-speed signal. The recess 46 of the main printed wiring board 26 is defined by an end surface 26a, and the auxiliary printed wiring board 28 is located near the end surface 26a in opposed relationship therewith.

Figure 17:
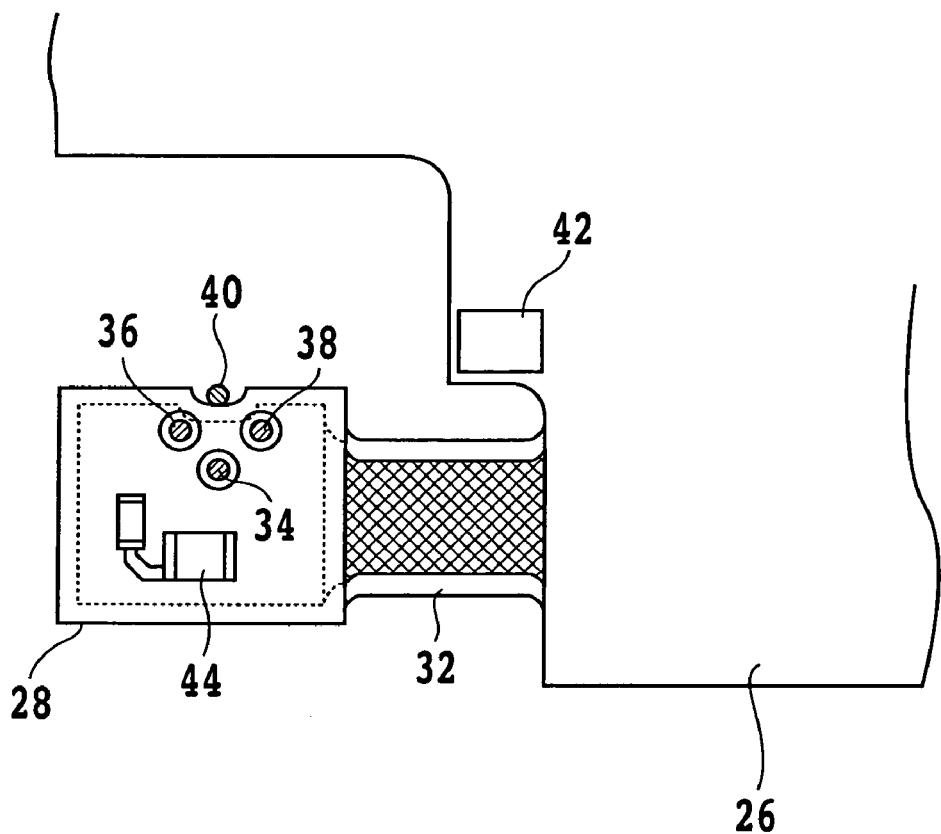
FIG. 17 is a plan view showing a condition where a main printed wiring board and an auxiliary printed wiring board in the second preferred embodiment are developed in the same plane.

FIG. 17 shows a condition where the auxiliary printed wiring board 28 and the main printed wiring board 26 are developed in the same plane. In this condition, components can be mounted simultaneously and automatically on the main printed wiring board 26 and the auxiliary printed wiring board 28, thereby realizing an optical module excellent in productivity. In this preferred embodiment, the auxiliary printed wiring board 28 is connected through the single flexible printed wiring board 32 having a large area to the main printed wiring board 26. The flexible printed wiring board 32 in this preferred embodiment is located opposite to the high-speed signal lead terminal 40 with respect to the center of arrangement of the high-speed signal lead terminal 40, the power supply lead terminal 34, and the grounding lead terminal 36.

In the first and second preferred embodiments, the flexible printed wiring boards 32, 32a, and 32b are preferably in the form of a mesh. The wiring component for connecting the main printed wiring board 26 and the auxiliary printed wiring board 28 is not limited to such a flexible printed wiring board. In FIGS. 12 and 16 respectively showing the first and second preferred embodiments, the LSI 30 mounted on the main printed wiring board 26 is not shown.

According to the present invention, the power supply lead terminal and the grounding lead terminal are connected to the auxiliary printed wiring board on which the capacitive component for reducing a stray capacitance is mounted, and the high-speed signal lead terminal is directly connected to the main printed wiring board, so that a stray capacitance and a stray inductance can be reduced and the inductance of a high-speed signal can also be reduced to thereby improve the characteristics of the optical module. Further, the metal casing of the optical element package is connected through the auxiliary printed wiring board and the wiring component having a relatively large area to the main printed wiring board, so that the ground potential of the optical element package can be stabilized.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An optical module comprising:
   an optical element package accommodating an optical element and having a high-speed signal lead terminal, a power supply lead terminal, and a grounding lead terminal each connected to said optical element;
   a main printed wiring board on which an integrated circuit is mounted;
   an auxiliary printed wiring board on which a capacitive component is mounted, said auxiliary printed wiring board being arranged substantially perpendicular to said main printed wiring board; and
   a wiring component for connecting said main printed wiring board and said auxiliary printed wiring board; wherein:

said auxiliary printed wiring board being arranged between said optical element package and said main printed wiring board in a direction of a plane of said main printed wiring board;

a recess being formed in said auxiliary printed wiring board, said recess being formed upward from a bottom surface of said auxiliary printed wiring board, the bottom surface being substantially perpendicular to a plane of said auxiliary printed wiring board, the capacitive component being mounted on the plane;

said power supply lead terminal and said grounding lead terminal being connected to said auxiliary printed wiring board;

said high-speed signal lead terminal being directly connected to said main printed wiring board through said recess.

2. The optical module according to claim 1, wherein said wiring component has flexibility.

3. The optical module according to claim 1, wherein said optical element comprises a light emitting element, and said integrated circuit comprises a drive circuit for driving said light emitting element.

4. The optical module according to claim 1, wherein said optical element comprises a photodetecting element, and said integrated circuit comprises a postamplifier for amplifying a current obtained by photoelectric conversion by said photodetecting element.

5. The optical module according to claim 1, wherein said wiring component has at least two connecting portions separated from each other in laterally opposite directions with respect to the center of arrangement of said high-speed signal lead terminal, said power supply lead terminal, and said grounding lead terminal.

6. The optical module according to claim 1, wherein said wiring component is located opposite to said high-speed signal lead terminal with respect to the center of arrangement of said high-speed signal lead terminal, said power supply lead terminal, and said grounding lead terminal.

7. The optical module according to claim 1, wherein said wiring component comprises a meshed wiring board.

8. An optical module comprising:

an optical element package accommodating an optical element and having a high-speed signal lead terminal, a power supply lead terminal, and a grounding lead terminal each connected to said optical element;

a main printed wiring board on which an integrated circuit is mounted, said main printed wiring board having a recess;

an auxiliary printed wiring board on which a capacitive component is mounted, said auxiliary printed wiring board being arranged substantially perpendicular to said main printed wiring board; and a flexible wiring component for connecting said auxiliary printed wiring board and an end portion of said main printed wiring board, said end portion defining said recess of said main printed wiring board; wherein:

said auxiliary printed wiring board being arranged between said optical element package and said main printed wiring board in a direction of a plane of said main printed wiring board;

said power supply lead terminal and said grounding lead terminal being connected to said auxiliary printed wiring board;

said high-speed signal lead terminal being directly connected to said main printed wiring board;

said recess of said main printed wiring board being defined by an end surface, and the auxiliary printed wiring board being located near the end surface in opposed relationship therewith.

9. The optical module according to claim 8, wherein said optical element comprises a light emitting element, and said integrated circuit comprises a drive circuit for driving said light emitting element.

10. The optical module according to claim 8, wherein said optical element comprises a photodetecting element, and said integrated circuit comprises a postamplifier for amplifying a current obtained by photoelectric conversion by said photodetecting element.

11. The optical module according to claim 8, wherein said flexible wiring component comprises a meshed wiring board.

12. A method of providing an optical module comprising:

accommodating an optical element in an optical element package;

connecting a high-speed signal lead terminal, a power supply lead terminal, and a grounding lead terminal to said optical element;

providing a main printed wiring board having a recess;

mounting an integrated circuit on the main printed wiring board;

mounting a capacitive component on an auxiliary printed wiring board;

arranging said auxiliary printed wiring board substantially perpendicular to said main printed wiring board;

arranging said auxiliary printed wiring board between said optical element package and said main printed wiring board in a direction of a plane of said main printed wiring board;

connecting said auxiliary printed wiring board and an end portion of said main printed wiring board with a flexible wiring component, said end portion defining said recess of said main printed wiring board;

connecting said power supply lead terminal and said grounding lead terminal to said auxiliary printed wiring board; and connecting said high-speed signal lead terminal directly to said main printed wiring board wherein:

said auxiliary printed wiring board being arranged in said recess;

said recess of said main printed wiring board being defined by an end surface, and the auxiliary printed wiring board being located near the end surface in opposed relationship therewith.

13. The optical module according to claim 1, wherein said wiring component comprises first and second wiring components, said recess being located between said first and second wiring components; said first and second wiring components being connected to said bottom surface.

* * * * *